United States Patent [19]
Chang

[11] Patent Number: 5,653,597
[45] Date of Patent: Aug. 5, 1997

[54] PIN SOCKET WITH CONNECTING PORTIONS

[75] Inventor: Shin-Hui Chang, Tainan, Taiwan

[73] Assignee: United Microelectronics Corporation, Hsinchu, Taiwan

[21] Appl. No.: 520,390

[22] Filed: Aug. 29, 1995

[51] Int. Cl.⁶ .................................................... H01R 9/09
[52] U.S. Cl. ................................................ 439/49; 439/189
[58] Field of Search ........................... 439/70, 71, 189, 439/49, 68, 82, 862, 874

[56] References Cited

U.S. PATENT DOCUMENTS

| | | | |
|---|---|---|---|
| 4,060,296 | 11/1977 | Kunkle et al. | 439/70 |
| 4,155,612 | 5/1979 | Silverio | 439/70 |
| 4,268,102 | 5/1981 | Grabbe | 439/70 |
| 4,460,236 | 7/1984 | Strautz | 439/70 |
| 4,943,891 | 7/1990 | Ouellette | 439/70 |

Primary Examiner—Neil Abrams
Assistant Examiner—Brian J. Biggi
Attorney, Agent, or Firm—Cushman, Darby & Cushman, IP Group of Pillsbury Madison & Sutro, LLP

[57] ABSTRACT

A socket that can be fixed on a circuit board for mounting an integrated circuit. The socket comprises a base and a plurality of socket pins, arranged along a periphery thereof, for electrically connecting to portions (pins) of the integrated circuit. Connecting portions are provided to each of the socket pins for soldering additional components thereon or short circuiting some of the socket pins to each other.

12 Claims, 7 Drawing Sheets

PIN SOCKET WITH CONNECTING PORTIONS

BACKGROUND OF THE INVENTION

1. Field of the Invention

The present invention relates in general to sockets for integrated circuits. More particularly, the present invention relates to a socket having socket pins which include a connecting portion.

2. Description of Related Art

Integrated circuit technology is now in widespread use. Most integrated circuit components are fixedly soldered on or attached to a circuit board by SMT (i.e., surface mounted technology). However, the above method is not conducive to the replacement of integrated circuit components on the board, and cannot provide a readably extendible space for additional integrated circuit components. Furthermore, some components that are sensitive to static electricity or temperature extremes will be damaged in a soldering process that is required to mount the integrated circuit by SMT. Therefore, in most electronic apparatuses, such as personal computers, pin sockets are first fixed on the board for mounting the integrated circuit components. However, it is also difficult to connect components to an integrated circuit which is plugged into a socket fixed on the board because the connecting process has to be performed on the opposite side of the board. That is, the board must be dismounted from the console of the electronic apparatus during the process. As a result, the work becomes complex and difficult. Moreover, since the conventional pin socket is fixedly mounted on the board, the pin socket cannot offer any flexibility for programming the pins of the integrated circuit plugged thereinto.

SUMMARY OF THE INVENTION

Accordingly, it is a primary object of the present invention to provide an improved socket for an integrated circuit component. The socket according to the present invention is fixed on a board for mounting integrated circuit components. The socket has a base having a plurality of socket pins protruding therefrom. At least one of the socket pins has a connecting portion formed thereon. The connecting portion can be used for soldering components to the socket pin and for connecting various socket pins to one another (short them) in order to "program" an integrated circuit component mounted in the socket. The board need not be dismounted while performing the component soldering. That is, the pins can be directly soldered with components or be programmed.

Other objects, features and advantages of the present invention will become apparent by way of the following detailed description of the preferred but non-limiting embodiments.

BRIEF DESCRIPTION OF THE DRAWINGS

The following detailed description, is provided as an example of the presently preferred embodiments and is not intended to limit the invention solely to the embodiments described herein. The description will be understood best when read in conjunction with viewing the accompanying drawings in which:

FIG. 1b (Prior Art) is a side view of a socket pin of the conventional socket shown in FIG. 1a;

FIG. 2b (Prior Art) is a side view of a socket pin of the conventional pin socket shown in FIG. 2a;

DETAILED DESCRIPTION OF THE PREFERRED EMBODIMENTS

Example 1

Figure 1A:
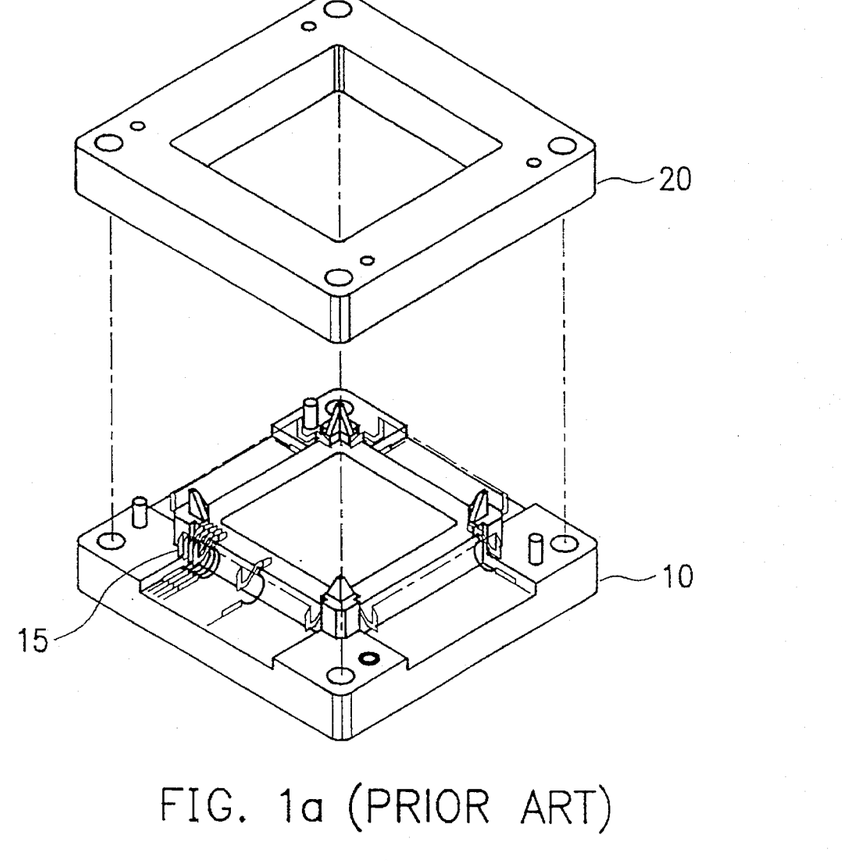
FIG. 1a (Prior Art) is a perspective view of a conventional socket for an integrated circuit component.
Figure 1B:
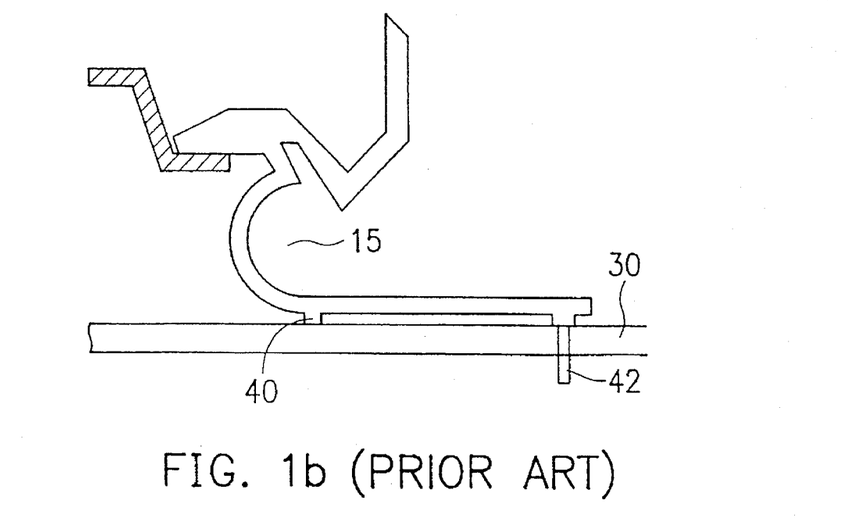

One conventional open-top socket is shown in FIG. 1a (Prior Art). The open-top socket comprises a base 10, from which a plurality of socket pins 15 protrude. A cap 20, having a top opening, fits over the base portion as suggested by the figure. FIG. 1b (Prior Art) is a side view of one of the plurality of socket pins 15. The width of each socket pin is about 0.5 mm, and the separation between any two neighboring socket pins ranges from 0.3 to 0.4 mm. Socket pin 15 includes portions 40 and 42 which are used to mount the socket onto a circuit board 30. If it is necessary to solder an electrical component to a socket pin or to electrically connect two or more of the socket pins, it is necessary to solder to one or more of the socket pins. The soldering process must be performed on the opposite side of the board from the socket pins 15. It is difficult to carry out such a soldering process. Also, soldering in this manner tends to produce long electrical paths between a component connected to the integrated circuit and the integrated circuit itself. This results in increased electrical noise.

Figure 1C:
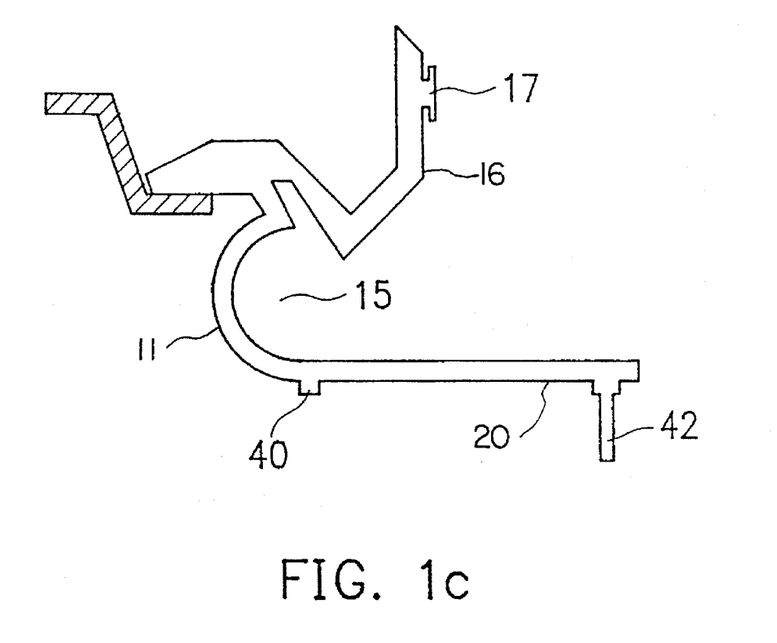
FIG. 1c is a side view of the socket pin of FIG. 1b which has been improved in accordance with this invention.

Recognizing this problem, the present invention provides one or more of the pin sockets 15 with a connecting portion 17, as shown in FIG. 1c. Using these connecting portions, electrical components can be directly soldered to a socket pin of the integrated circuit socket. Also, two or more socket pins can be easily electrically connected (shorted) as needed. As a result of this improvement, it is not necessary dismount and remount a socket from the circuit board each time it is desired to connect a component to a socket pin.

The pin socket 15 includes an upper elongate portion 16 spaced from the base (not shown) and a lower elongate portion 20. Lower elongate portion 20 is typically parallel with the portion of the base at which the pin socket is attached and, together with portions 40 and 42, forms an attachment structure for attaching the pin socket to the base. The upper elongate portion 16 is connected to the lower elongate portion 20 via an intermediate portion 11.

The upper elongate portion 16 extends upright and is spaced from the base. In this embodiment, upper elongate portion 16 is substantially perpendicular to lower elongate portion 20.

Figure 1D:
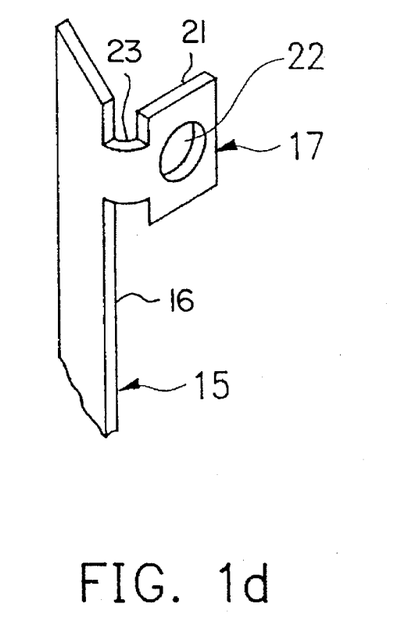
FIG. 1d is an enlarged partial perspective view of FIG. 1c.
Figure 1E:
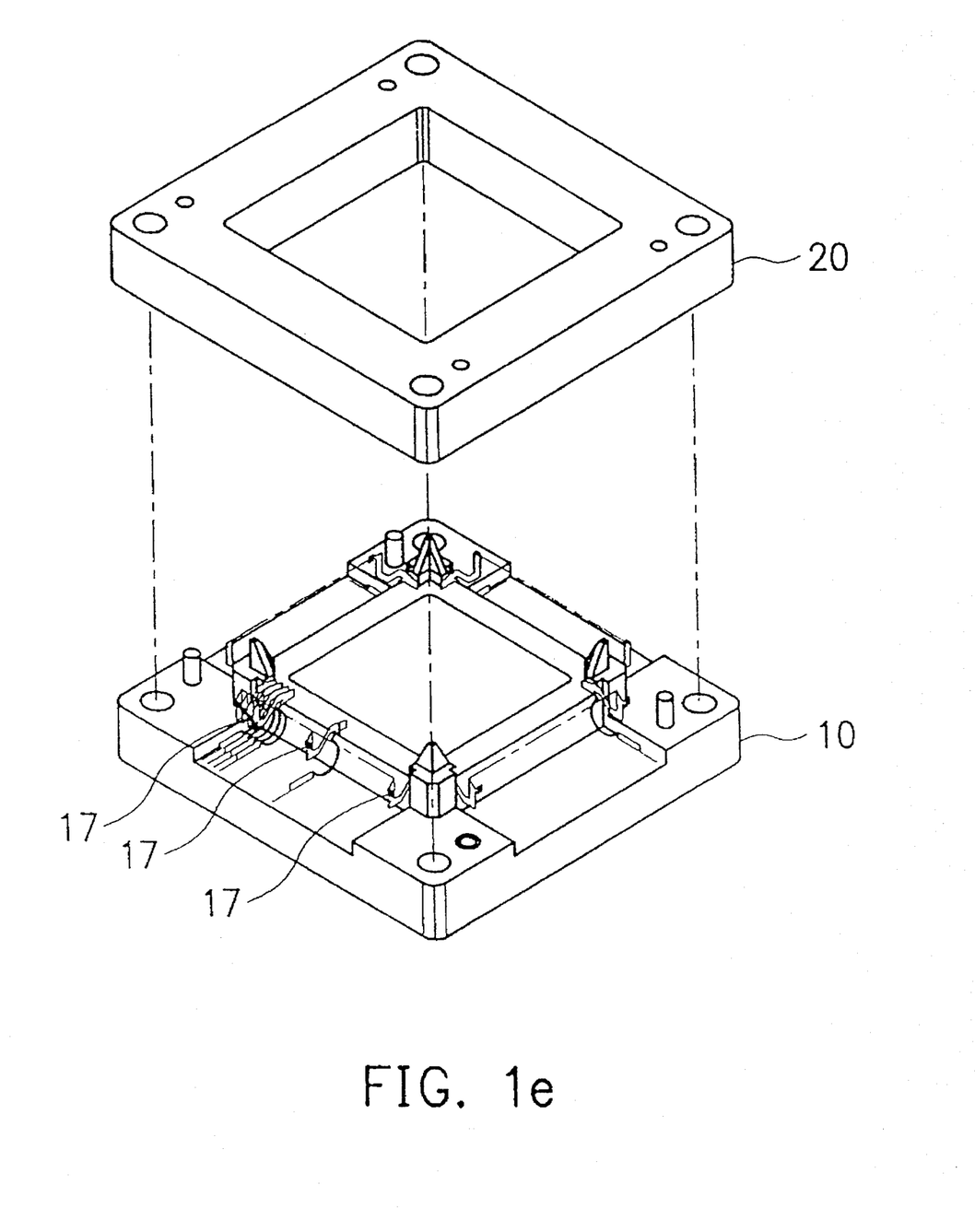
FIG. 1e is a perspective view of the pin socket which has been improved in accordance with this invention.
Figure 1F:
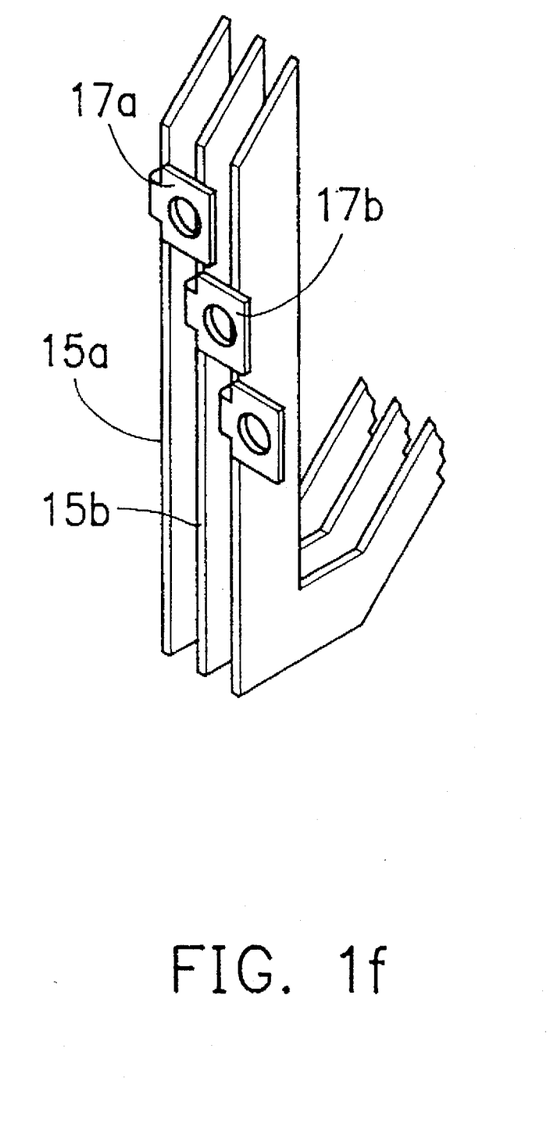
FIG. 1f is a partially enlarged view of the pin socket shown in FIG. 1e.

Referring to FIG. 1d, the connecting portion 17 of each socket pin is an area extended from a predetermined position of the upper elongate member 16 of the socket pin 15. The surface of the connecting portion can be used for soldering, and its shape and dimension depend on practical necessity. For example, a square flat plate connecting area 21 having a bore 22 at its center and an area of about 2.25 mm² (i.e., 1.5 mm×1.5 mm) is employed in this embodiment. An extending arm 23 connects flat plate connecting area 21 to the upper elongate portion 16. Reference is now made to FIG. 1e, which is a schematic perspective view of a socket according to this invention. As shown in the drawing, the connecting portions of any two neighboring socket pins are separated from each other to avoid shorting. As to the configuration of the connecting portions, the only requirement for any configuration is that the connecting portions of any two neighboring socket pins cannot be shorted. In this embodiment, the connecting portions are arranged sequentially arranged from top to bottom. In other words, as shown in FIG. 1f, the connection portion 17a of a first pin 15a is higher with respect to the circuit board 30 than the connecting portion 17b of a second pin 15b, next to the first pin 15a.

Example 2

Figure 2A:
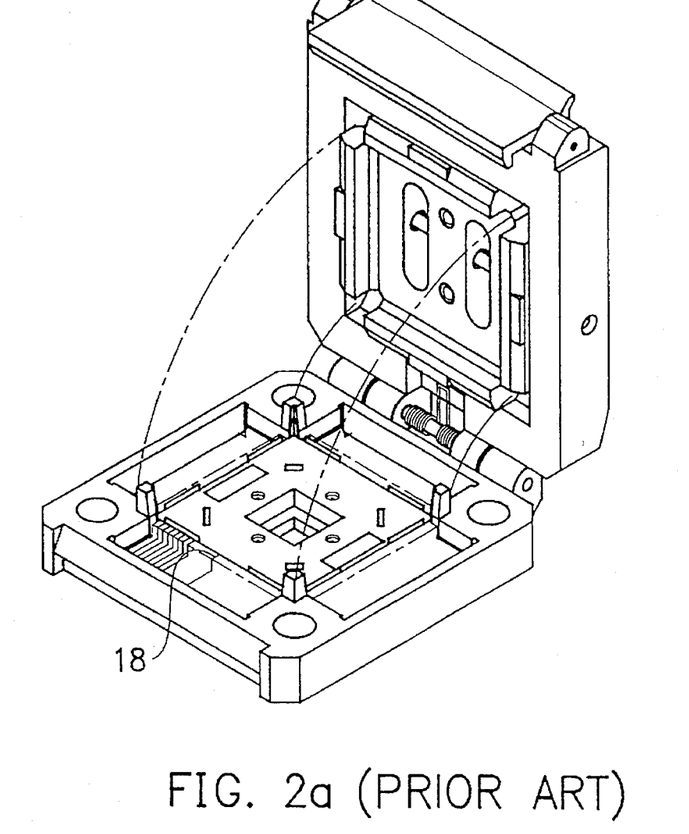
FIG. 2a (Prior Art) is a perspective view of another conventional pin socket.
Figure 2B:
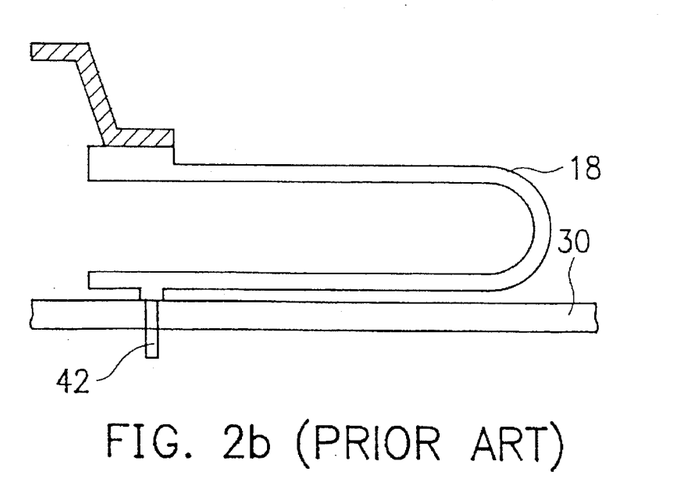
Figure 2C:
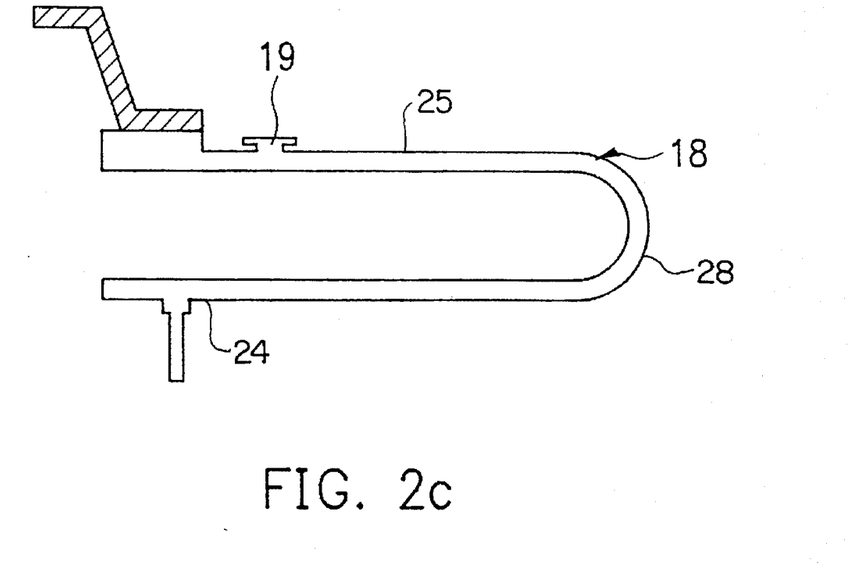
FIG. 2c is a side view of the socket pin of FIG. 2b which has been improved in accordance with this invention.
Figure 2D:
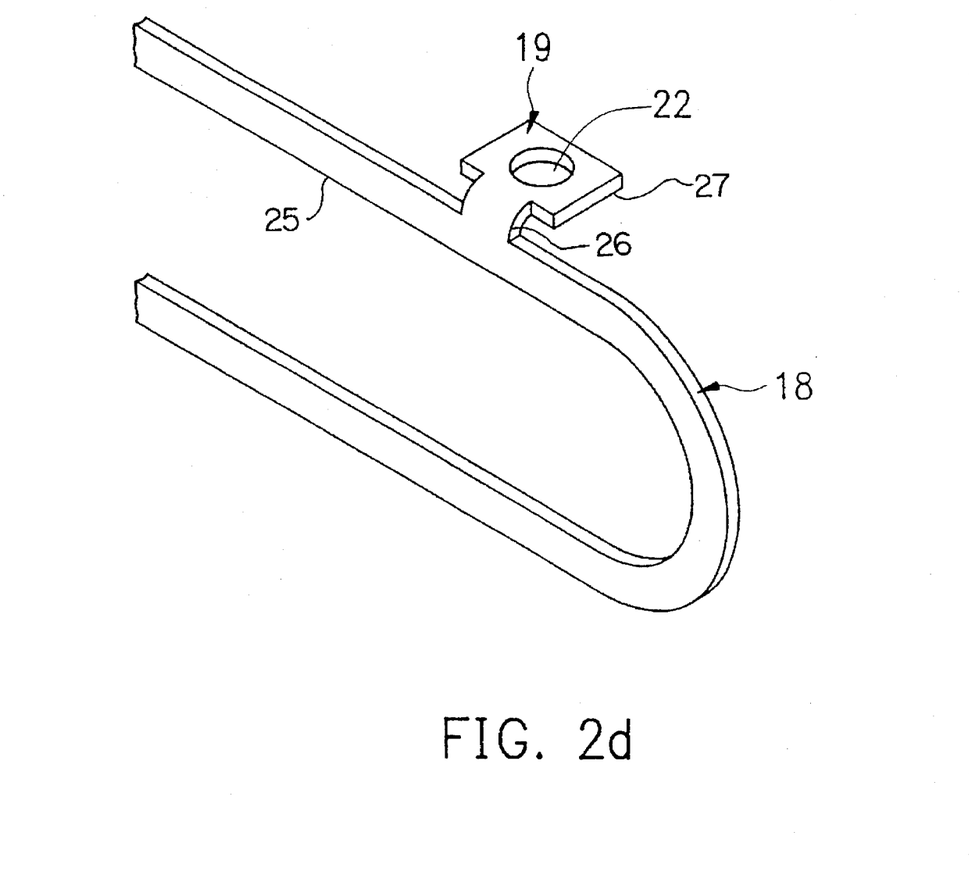
FIG. 2d is an enlarged partial perspective view of FIG. 2c.

Referring to FIG. 2a (Prior Art), which illustrates another conventional pin socket, that is, the clam-shell socket. The socket pins are denoted by reference numeral 18. The side view of a socket pin of the clam-shell socket is illustrated in FIG. 2b (Prior Art). The socket pins 18 have a "U" shape and include portions 42 for connected them to circuit board 30. As shown in FIG. 2C, the pin socket 18 of this embodiment includes a lower elongate portion 24, an upper elongate portion 25, and an intermediate portion 28. In this embodiment, upper elongate portion 25 is substantially parallel to lower elongate portion 24. The improvement of the present invention over this particular prior art arrangement is shown in FIG. 2c. As shown in the figure, socket pin 18 is provided with a connecting portion 19 which can be used for soldering either an electrical component thereto or connecting to another socket pin 18. This, is similar to the previous embodiment. The enlarged partial perspective view of the socket pin in this embodiment is illustrated as FIG. 2d. The connecting portion 19 of this embodiment also includes a flat plate connecting area 27 that is shaped similarly to connecting area 21 in the first embodiment. It is essentially a square area having a bore therein. An extending arm 26 connects flat plate connecting area 27 to upper elongate portion 25.

Figure 2E:
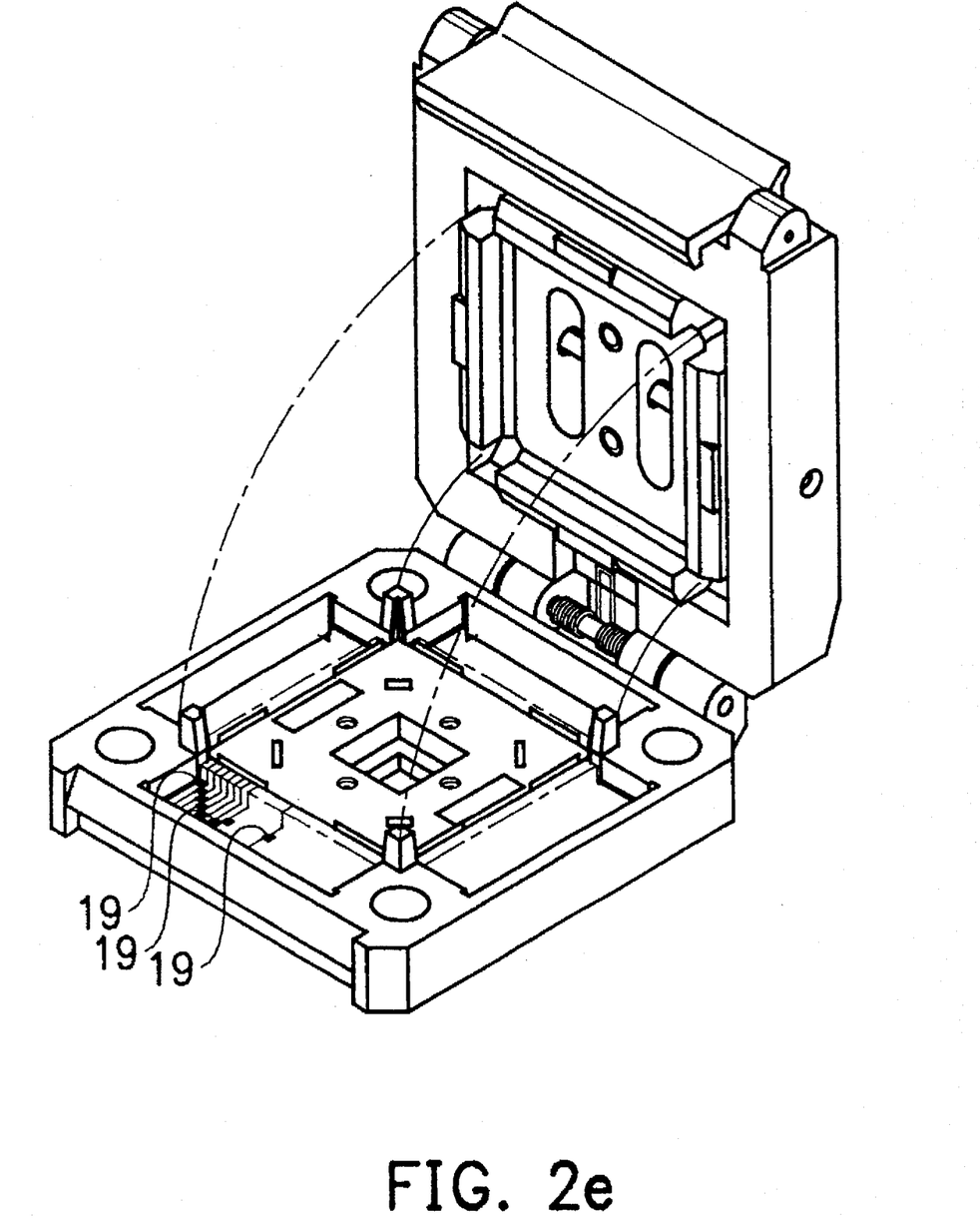
FIG. 2e is a perspective view of the pin socket that has been improved according to this invention.

FIG. 2e schematically illustrates a perspective view of the clam-shell socket in which the connecting portions thereof are arranged sequentially from top to bottom, looking at the arrangement of pins from above. This makes it easy to avoid accidental shorting of adjacent pins.

Using the principles of the present invention, a socket arrangement can be constructed so that it is easier to attach an electrical component to a socket pin without creating an unduly long path length between the component and the pin. In each of the embodiments illustrated and discussed above, the path length between a component and an integrated circuit chip can be shorten and the noise generated in the path can be reduced by using the connecting portion to solder the component thereto. This is especially effective when the soldered component is a capacitor for reducing noise.

By the improvement of the present invention, in addition to reducing the noise described above, the connecting portion also can be used to connect two or more pins of an integrated circuit chip. This can save space on a board and lower its complexity. For example, if one signal has to be provided to many different pins of the integrated circuit chip, then only one of the pins needs to be connected to the signal, the others are just connected together with the pin receiving the signal by the connecting portions on the corresponding socket pins. Moreover, when a pin socket is soldered onto a circuit board, especially a multilayer board, the connecting portions of socket pins can be employed to input signals so that if only a few of IC pins alter the input signals, it is not necessary to dismount the board. Accordingly, the flexibility of the use of a board is increased.

While the present invention has been particularly shown and described with reference to one or more preferred embodiments, it will be readily appreciated by those of ordinary skill in the art that various changes and modifications may be made without departing from the spirit and scope of the invention. It is intended that the claims be interpreted to cover the disclosed embodiment(s), those alternatives which have been discussed above and all equivalents thereto.

What is claimed is:

1. A socket fixable on a board for mounting integrated-circuit components, said socket comprising:
    a base for mounting the integrated circuit components thereon; and
    a plurality of socket pins arranged along a peripheral portion of said base for electrically connecting to pins of an integrated circuit, each of said plurality of socket pins comprising an upper elongate portion having a planar surface and disposed in a spaced relation with respect to said base, at least one of said plurality of socket pins having a connecting portion extending laterally outwardly from said upper elongate portion with respect to a lengthwise direction of said upper elongate portion for making an electrical connection therewith, said connecting portion comprising a flat plate member oriented substantially perpendicularly to said planar surface of said upper elongate member.

2. A socket according to claim 1, wherein each of said socket pins includes a first end portion for connecting with said board, a second end portion for electrically connecting to a portion of the integrated circuit, said second end portion being opposite to said first end portion, and a middle portion disposed between said first end portion and said second end portion, said connecting portion being located on said middle portion.

3. A socket according to claim 1, wherein each of said socket pins includes a first end portion for connecting with said board, a second end portion which is opposite to said first end portion, said connecting portion being located on said second end portion, and a middle portion for electrically connecting with a portion of said integrated circuit, said middle portion being between said first end portion and said second end portion.

4. A socket according to claim 2, wherein said connecting portion is provided on alternating ones of said plurality of socket pins so that any two adjacent socket pins of said plurality of socket pins are electrically isolated.

5. A socket according to claim 3, wherein said connecting portion is provided on alternating ones of said plurality of socket pins so that any two adjacent socket pins of said plurality of socket pins are electrically isolated.

6. A socket according to claim 1, wherein said connecting portion is provided on each of said plurality of socket pins.

7. A socket according to claim 1 wherein said connecting portion is provided on adjacent pins of said plurality of socket pins and said connecting portions of said adjacent pins are positioned differently from one another on adjacent socket pins so that connecting portions of adjacent pins are not aligned with each other.

8. The socket of claim 1 wherein said flat plate member of said connecting portion has a substantially rectangular shape.

9. The socket of claim 1 wherein said flat plate member of said connecting portion has a bore extending therethrough.

10. The socket of claim 1 wherein each of said plurality of socket pins comprises base attachment structure constructed and arranged to enable said socket pin to be attached to said base and said attachment structure comprises a lower elongate portion substantially parallel to a portion of said base at which said socket pin is attached thereto and said upper elongate portion of said pin is substantially perpendicular to said lower elongate portion of said attachment structure.

11. The socket of claim 1 wherein each of said plurality of socket pins comprises base attachment structure constructed and arranged to enable said socket pin to be attached to said base and said attachment structure comprises a lower elongate portion substantially parallel to a portion of said base at which said socket pin is attached thereto and said upper elongate portion of said pin is substantially parallel to said lower elongate portion of said attachment structure.

12. The socket of claim 1 wherein said connecting portion further comprises an extending arm extending from said upper elongate portion and connecting said flat plate member to said upper elongate portion.

* * * * *